(12) United States Patent
Wicpalek et al.

(10) Patent No.: US 9,832,011 B1
(45) Date of Patent: Nov. 28, 2017

(54) PERFORMANCE INDICATOR FOR PHASE LOCKED LOOPS

(71) Applicant: Intel IP Corporation, Santa Clara, CA (US)

(72) Inventors: Christian Wicpalek, Puchenau (AT); Tobias Buckel, Linz (AT); Andreas Menkhoff, Oberhaching (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/198,115

(22) Filed: Jun. 30, 2016

(51) Int. Cl.
| | |
|---|---|
| *H04L 7/033* | (2006.01) |
| *H04L 12/26* | (2006.01) |
| *H04L 12/24* | (2006.01) |
| *H03C 3/09* | (2006.01) |
| *H03L 7/193* | (2006.01) |

(Continued)

(52) U.S. Cl.
CPC .......... *H04L 7/033* (2013.01); *H04L 41/0681* (2013.01); *H04L 43/028* (2013.01); *H03C 3/095* (2013.01); *H03C 3/0916* (2013.01); *H03C 3/0925* (2013.01); *H03C 3/0941* (2013.01); *H03C 3/0958* (2013.01); *H03C 3/0966* (2013.01); *H03C 3/20* (2013.01); *H03L 7/08* (2013.01); *H03L 7/081* (2013.01); *H03L 7/0802* (2013.01); *H03L 7/085* (2013.01); *H03L 7/087* (2013.01); *H03L 7/089* (2013.01); *H03L 7/0891* (2013.01); *H03L 7/091* (2013.01); *H03L 7/093* (2013.01); *H03L 7/099* (2013.01); *H03L 7/0995* (2013.01); *H03L 7/104* (2013.01); *H03L 7/1075* (2013.01); *H03L 7/113* (2013.01); *H03L 7/18* (2013.01); *H03L 7/183* (2013.01); *H03L 7/193* (2013.01); *H03L 7/1976* (2013.01); *H03L 2207/06* (2013.01); *H03L 2207/50* (2013.01)

(58) Field of Classification Search
CPC ... H04L 7/033; H04L 41/0681; H04L 43/028; H03L 7/093; H03L 7/085; H03L 7/089; H03L 7/08; H03L 2207/50; H03L 7/0891; H03L 7/1976; H03L 2207/06; H03L 7/0802; H03L 7/081; H03L 7/087; H03L 7/091; H03L 7/099; H03L 7/0995; H03L 7/104; H03L 7/113; H03L 7/18; H03L 7/183; H03L 7/193; H03C 3/0941; H03C 3/0916; H03C 3/095; H03C 3/0966; H03C 3/0925; H03C 3/0958; H03C 3/20
See application file for complete search history.

(56) References Cited

U.S. PATENT DOCUMENTS

| | | | |
|---|---|---|---|
| 6,018,556 A * | 1/2000 | Janesch | H03L 7/0991 375/326 |
| 8,076,960 B2 * | 12/2011 | Geng | H03C 3/0941 327/147 |

* cited by examiner

*Primary Examiner* — Janice Tieu
(74) *Attorney, Agent, or Firm* — Eschweiler & Potashnik, LLC

(57) ABSTRACT

Performance indicator circuitry is provided for characterizing performance of a phase locked loop (PLL) in a phase path of a polar modulator or polar transmitter that is used to generate a phase modulated RF signal. The PLL includes an oscillator, a high pass path, and a low pass path. The low pass path includes a loop filter. The performance indicator circuitry includes first input circuitry and parameter calculation circuitry. The first input circuitry is configured to input a loop filter signal from the loop filter. The parameter calculation circuitry is configured to compute a value for a performance indicator based on the loop filter signal and control or characterize an aspect of operation of the PLL based on the value.

15 Claims, 5 Drawing Sheets

(51) Int. Cl.
*H03L 7/10* (2006.01)
*H03L 7/099* (2006.01)
*H03L 7/085* (2006.01)
*H03L 7/18* (2006.01)
*H03L 7/113* (2006.01)
*H03L 7/081* (2006.01)
*H03L 7/093* (2006.01)
*H03L 7/197* (2006.01)
*H03L 7/107* (2006.01)
*H03L 7/183* (2006.01)
*H03L 7/091* (2006.01)
*H03L 7/08* (2006.01)
*H03L 7/089* (2006.01)
*H03L 7/087* (2006.01)
*H03C 3/20* (2006.01)

PERFORMANCE INDICATOR FOR PHASE LOCKED LOOPS

BACKGROUND

Phase locked loops (PLLs) can provide precise generation and alignment of timing for a wide variety of applications, such as for clock generation or clock data recovery. In digital phase-locked loops (DPLLs) a digital loop filter is utilized to replace analog components. For example, all-digital phase locked loops (ADPLLs) are designed to utilize digital techniques throughout and can comprise a phase frequency detector, a loop filter, an oscillator, and a frequency divider.

DETAILED DESCRIPTION

Figure 1:
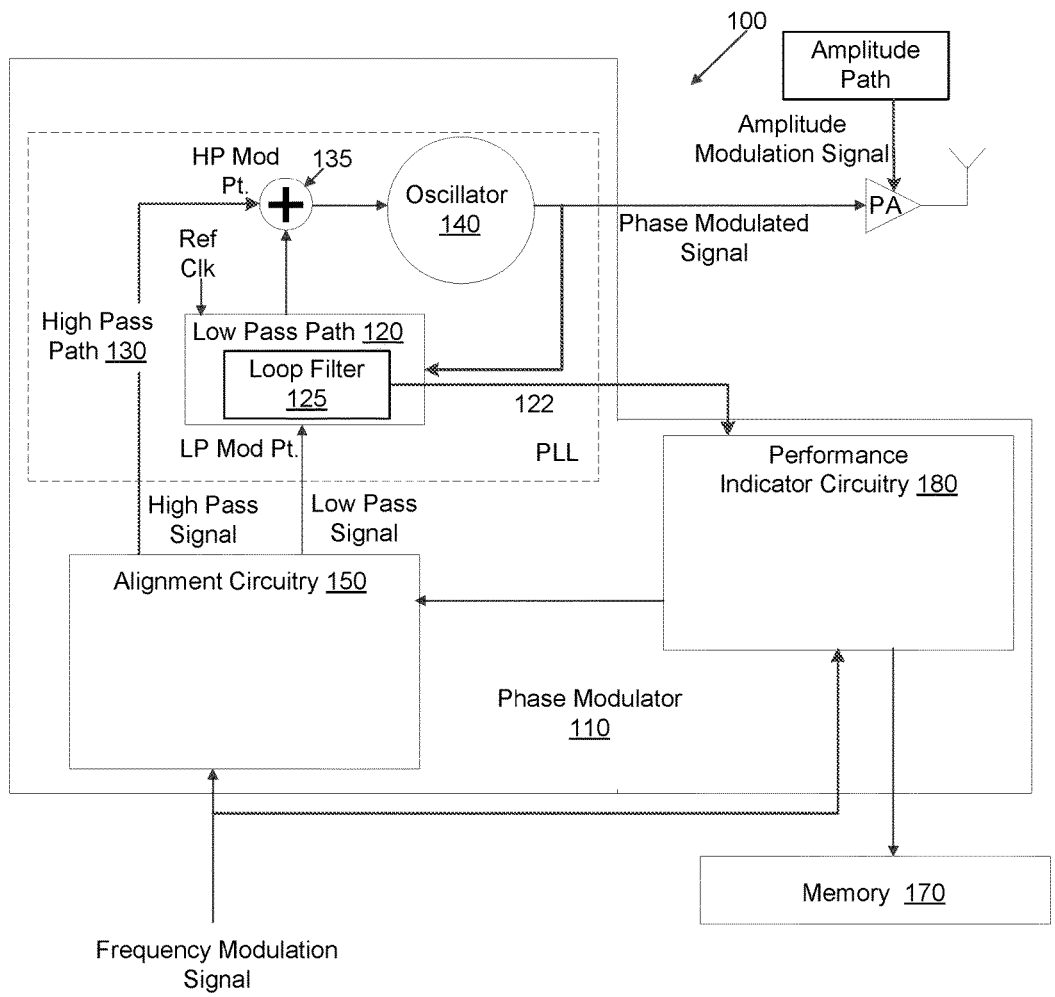
FIG. 1 illustrates an exemplary polar transmitter system with PLL that includes performance indicator circuitry in accordance with various aspects described.

Digital PLLs are often used for phase modulation in a polar transmitter or polar modulator. A polar modulator or transmitter includes two separate modulation paths: a phase modulation path and an amplitude modulation path. The phase modulation path includes phase modulator circuitry that processes a frequency or phase component of a polar data sample to generate a phase modulated RF signal. The amplitude path includes circuitry that processes a magnitude component of the polar data sample to generate an amplitude modulation signal. In a polar transmitter, a power amplifier is used to recombine the phase modulated RF signal based on the amplitude modulation signal to produce an RF signal that encodes the data sample.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuitry" and the like are intended to refer to a computer-related entity, hardware, software (e.g., in execution), and/or firmware. For example, a circuitry can be a circuit, a processor, a process running on a processor, a controller, an object, an executable, a program, a storage device, and/or a computer with a processing device.

FIG. 1 illustrates one embodiment of polar transmitter architecture 100 that includes a PLL system used as a two-point phase modulator 110. The phase modulator 110 includes a low pass (LP) path 120, a high pass (HP) path 130, an oscillator 140, and alignment circuitry 150. The amplitude path 105 of the polar transmitter 100 is shown schematically in FIG. 1 as outputting an amplitude modulation signal to a power amplifier (PA) that generates the output of the polar transmitter 100. The phase modulator 110 includes the oscillator 140. The output of the oscillator 140 is the phase modulated signal that is input to a power amplifier (PA). While the invention will be described in the context of a polar transmitter, with a DPLL which has a multi modulus divider (MMD) in the feedback loop, the techniques described herein are also applicable to divider-less DPLLs.

The phase modulator 110 is a two point modulator, meaning that the modulator injects the frequency modulation signal to summation circuitry 135 in front of the oscillator 140 at a so-called HP modulation point and also to a frequency divider in the low pass path 120 (the divider is not shown in FIG. 1, see FIG. 2 MMD circuitry 238) at a so-called LP modulation point. The low pass path 120 includes a loop filter 125. The loop filter 125 is configured to filter a phase error between a reference clock signal and a feedback signal from the oscillator 140 and also to stabilize and set the PLL type (I or II).

The HP path should be aligned with the LP path to achieve good phase modulation performance. This means that the timing and amplitude of the frequency modulation signal at the HP modulation point ("the HP signal") should precisely be aligned to the frequency modulation signal at the LP modulation point ("the LP signal") in terms of amplitude and delay to minimize the distortion of the phase modulated RF signal.

The alignment circuitry 150 is configured to generate the LP signal and the HP signal from the frequency modulation signal. To align the LP signal with the HP signal, the alignment circuitry 150 adjusts the delay between the signals to compensate for the differences in delay caused by the paths taken by each signal. This compensation process is known as LP/HP delay compensation. The alignment circuitry normalizes the HP signal to the oscillator gain. This compensation process is known as HP gain compensation. Any mismatch between the LP signal and the HP signal will result in imperfect signal cancellation within the PLL resulting in additional distortion of the phase modulated RF signal and reduction in the performance of the polar transmitter 100.

Calibration or evaluation of the alignment circuitry 150 is typically done based on the recombined phase and amplitude signal, such as the signal output by the PA. The signal output by the PA includes both the phase modulated signal and the amplitude control signal, which complicates the calibration process because changes made to the LP and HP delay in turn affect phase path and amplitude path delay. Further, when the alignment circuitry is calibrated during a boot phase the alignment process may become less effective as the oscillator linearity changes over time due to temperature.

The phase modulator 110 includes performance indicator circuitry 180 that is configured to calculate a value for a performance indicator. The value of the performance indicator quantifies some aspect of the quality and/or performance of the phase path. The performance indicator circuitry 180 calculates the value based on a signal 122 from the loop filter 125 and in some circumstances also the frequency modulation signal. By using a signal from the low pass path to calculate the value, the performance indicator circuitry 180 operates independently of the amplitude path. Thus the performance indicator circuitry 180 effectively decouples the phase path from the amplitude path. This reduces the dimension of the calibration or evaluation process since the amplitude path does not need to be accounted for, which in turn reduces the time and effort to evaluate modulator performance.

The performance indicator value calculated by the performance indicator circuitry 180 is used to control an aspect of the operation of the phase modulator. In one embodiment, the value is stored in a memory 170 for use in calibrating the PLL. In another embodiment, the value is provided to the alignment circuitry 150 for use in adapting the frequency modulation signal for two point modulation by the PLL.

Figure 2:
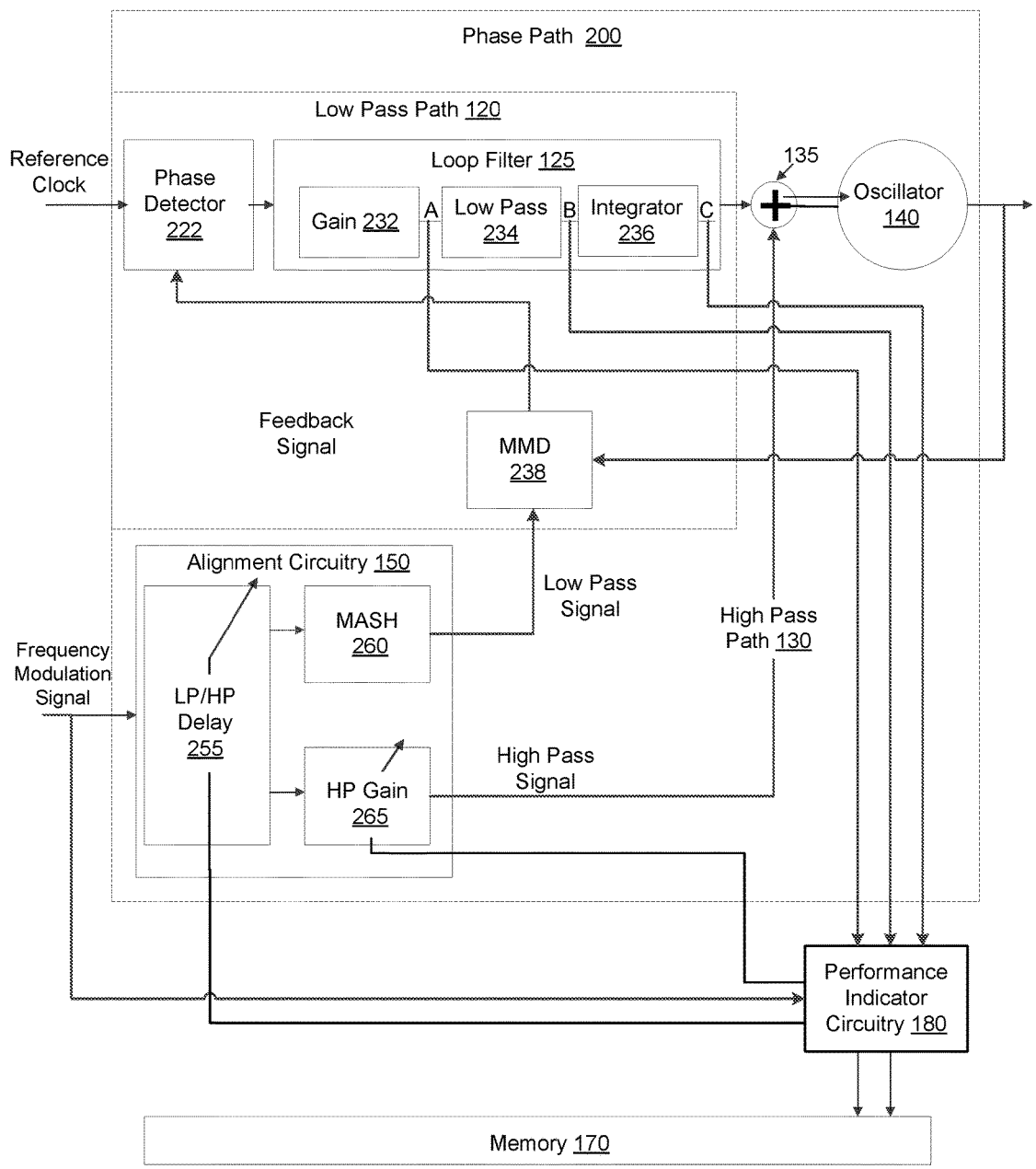
FIG. 2 illustrates another exemplary PLL system that includes performance indicator circuitry in accordance with various aspects described.

FIG. 2 illustrates one embodiment of a phase path 200 of a polar modulator. The various circuitry in the phase path 200 perform two point modulation on a frequency modulation signal to generate a phase modulated signal. Recall that the phase modulated signal is combined with an amplitude control signal from an amplitude path (not shown) to generate an RF signal for transmission.

The phase path 200 includes the oscillator 140, which is configured to generate the phase modulated signal based on a control signal that corresponds to a sum of the output of the high pass path 130 and the low pass path 120 (as computed by the summation circuitry 135). The low pass path 120 includes the loop filter 125. The loop filter 125 includes a series of circuitry configured to filter a phase error (as computed by phase detector 222) between a feedback signal and a reference clock signal and to stabilize the feedback loop. The feedback signal is based on the low pass signal and an output of the oscillator 140. Each circuitry in the loop filter outputs a respective unique signal. For example, gain circuitry 232 outputs an amplified signal (A), low pass filter 234 outputs a filtered signal (B), and integrator circuitry 236 outputs an integrated signal (C).

The phase path 200 includes the alignment circuitry 150 which is configured to process the frequency modulation signal to produce the low pass signal and the high pass signal that are injected into the PLL at the low pass point and high pass point, respectively. The alignment circuitry 150 includes LP/HP delay circuitry 255, multi-stage-noise-shaping (MASH) circuitry 260, and HP gain circuitry 265. In general, the LP/HP delay circuitry 255 aligns the high pass signal and low pass signal in time, while the HP gain circuitry 265 adjusts the amplitude of the high pass signal to compensate for the gain of the oscillator 140. The LP/HP delay circuitry 255 may include a delay line with a multiplexer so that either the low pass path 120 or the high pass path 130 can include a delay corresponding to a certain number of samples. The LP/HP delay path 120 may include an allpass to compensate for delays corresponding to fractions of a sample.

The MASH circuitry 260, the output of which is the low pass signal that is injected to the PLL at the low pass modulation point, generates a sequence of integer divider ratios from the frequency modulation signal. The integer divider ratios are used to achieve fractional ratios between the reference clock signal and the desired frequency of the phase modulated RF signal. The divider ratios are synched into multi modulus divider (MMD) circuitry 238 of the PLL. The MMD circuitry 238 counts oscillator cycles until the divider ratio from the MASH circuitry 260 is reached. When the divider ratio is reached, the MMD circuitry 238 outputs a pulse which is compared by the phase detector 222 with the reference clock signal's edge.

The phase detector 222 outputs the phase error which is a digital word that represents the quantized time difference between the MMD circuitry 238 output pulse and the reference clock edge. The phase error output by the phase detector 222 is filtered by the loop filter 125 and added to the high pass signal by the summation circuitry 135. The result of the summation operation is the control signal that is used to control the frequency of the oscillator 140.

The performance indicator circuitry 180 is configured to input a selected signal from the loop filter 125 and calculate a value for a performance indicator based at least on the loop filtered signal. During phase modulation, the loop filter signals (e.g., A, B, C in FIG. 2) include no modulation signal content when the high pass signal is well matched with the low pass signal. Thus, a scalar measure of the amount of modulation signal in any of the loop filter signals provides a good indication as to how well the high pass signal is matched to the low pass signal. In one embodiment, the filtered signal B output by the low pass filter 234 can be monitored by the performance indicator circuitry 180 and some statistical characterization of the filtered signal can serve as the performance indicator. In a type II PLL, the mean value of the filtered signal is 0. Therefore, the performance indicator might be the root-mean-squared (RMS) of the filtered signal, the variance of the filtered signal, the standard deviation of the filtered signal, the minimum of the filtered signal, or the maximum of the filtered signal.

In one embodiment, the performance indicator circuitry 180 is configured to store the value in a memory 170 for use in calibrating the phase path 200. In one embodiment, the memory 170 includes hardware registers or fast-ports configured to store performance indicator values for use during Built-In-Self-Test (BIST), auto-calibration, debugging, and so on.

Figure 3:
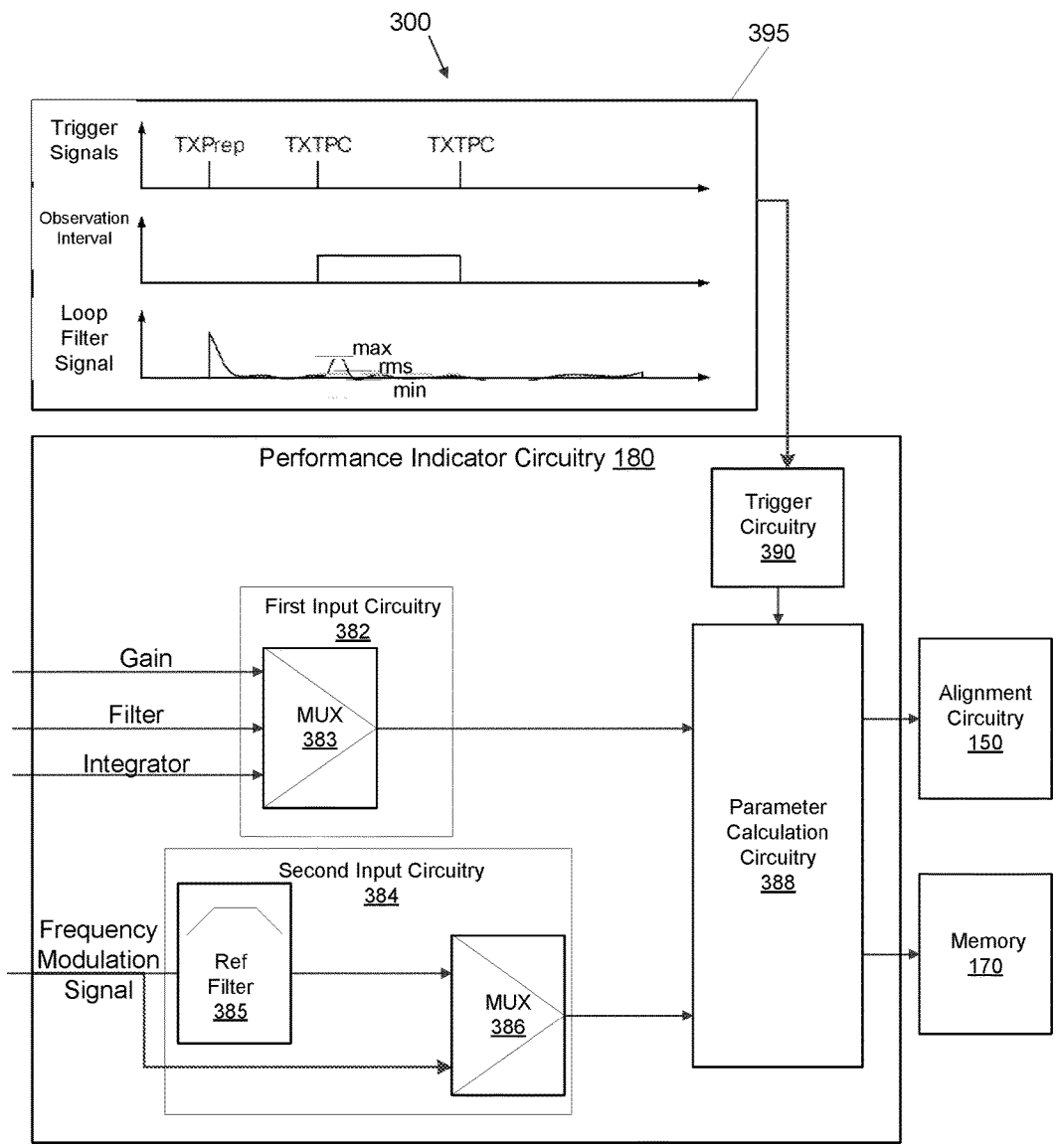
FIG. 3 illustrates an exemplary performance indicator circuitry in accordance with various aspects described.

FIG. 3 illustrates one embodiment of the performance indicator circuitry 180. The performance indicator circuitry 180 includes first input circuitry 382, second input circuitry 384, parameter calculation circuitry 388, and trigger circuitry 390. The parameter calculation circuitry 388 may be embodied as a processor, firmware, or any other appropriate component that is capable of performing statistical analysis on a selected loop filtered signal to calculate a value for the performance indicator. The first input circuitry 382 includes a multiplexer 383 that inputs the unique loop filter signals (e.g., the amplified signal, the filtered signal, and the integrated signal) and outputs a selected one of the loop filter signals to the parameter calculation circuitry 388 for use in calculating the performance indicator value. While three specific loop filter signals are disclosed, other signals related to the loop filter may also be used to calculate the performance indicator value. As discussed above, the parameter calculation circuitry 388 may calculate an RMS, variance, standard deviation, minimum, and/or maximum of the selected loop filtered signals as the value of the performance indicator.

The parameter calculation circuitry 388 may be configured to perform a least mean square (LMS) based correlation between the selected loop filtered signal and the frequency modulation signal to detect modulation signal content when different values for tuning parameters for the LP/HP delay circuitry (255 in FIG. 2) and/or the HP gain circuitry (265 in FIG. 2) are used. To facilitate this operation, the second input circuitry 384 includes a reference filter 385 and a multiplexer 386. The reference filter generates a signal directly proportional to the error that would result by shaping the frequency modulation signal by the PLL transfer characteristic seen from the high pass path injection point 135 to one of the signals A, B, or C of the loop filter 125. Utilizing the low-pass filter output signal B, the above described transfer characteristic of the PLL resembles a band-pass behavior and the reference filter is configured to also show this transfer characteristic. The shaped signal can then be used by the parameter calculation circuitry 388 when the circuitry 388 is performing the LMS based parameter updates of either the LP/HP delay 255 or the HP gain 265.

The multiplexer 386 provides a selected one of the unfiltered frequency modulation signal and the filtered frequency modulation signal for use by the parameter calculation circuitry 388 in calculating the value of the performance indicator (e.g., a correlation between the loop filtered signal and the frequency modulation signal).

The performance indicator circuitry 180 may be configured to adjust the tuning parameters of the LP/HP delay circuitry and/or the gain circuitry in the alignment circuitry 150 based on the value of the performance indicator during calibration of the phase path 210. In one embodiment, the performance indicator circuitry 180 is configured to provide the performance indicator value to the alignment circuitry 150 so that the alignment circuitry 150 may use the value to adjust the tuning parameters.

The trigger circuitry 390 is configured to detect trigger signals from other circuitry in the PLL and, in response, cause the parameter calculation circuitry 388 to perform the statistical analysis of the loop filtered signal to calculate the value for the performance indicator. In the embodiment shown in FIG. 3, the trigger signals are TX power up (including PLL power up) (TXTPrep) and TX power change (TXTPC), which are macro programming commands. Hardware sequencer blocks that generate these commands or firmware that sets bits in a hardware register to trigger operation of the macro program may be monitored by the trigger circuitry 390 or otherwise provide the trigger signals. In one embodiment, triggering is aligned with a start of a new slot or TTI in case of LTE uplink transmission to get an accurate and deterministic indicator for DigRF tracing as debugging information. As can be seen in FIG. 3, after triggering (first TXTPC) the performance indicator (e.g., min, max, root mean square, and so on) is calculated over some configurable number of reference clock cycles to produce a scalar value.

The performance indicator circuitry 180 may be used in any number of ways to calibrate and measure the performance of a PLL. The performance indicator circuitry 180 can be used to adjust PLL loop parameters using a constant envelope test signal. In RF transmitters amplitude variations cause oscillator pulling or instantaneous detuning of the oscillator. So a time varying interferer will be converted into a time varying frequency. To avoid AM-FM disturbance (like H2 coupling or LDO variation coupling) from a digital to analog converter (DAC) or PA, a constant envelope RF signal may be input to the PLL (i.e., as the frequency modulation signal) and the loop parameters may be adjusted until the performance indicator value indicates proper function. The constant envelope RF signal may be generated by either a nonlinear modulation scheme or a linear modulation scheme. Continuous phase modulation like GSM is a type of nonlinear modulation. Since the internal GSM hardware in a PLL typically has a small bandwidth (e.g., 270.83 kbits/s), GSM hardware will cause only moderate PLL modulation. Thus, GSM like samples with higher bandwidth/sampling rate may be fed to the PLL via the I/Q interface.

Linear modulation is used to build up the internal signal generation for UMTS. To achieve a constant envelope offset QPSK modulation is used. The pulse shaping filters are built up in a way that the square of the in-phase pulse shaping filter plus the square of the time shifter quadrature pulse shaping filter result in a constant envelope. For example, $+/-\sin(x)$, $0<x<\pi$ could be used as a pulse shaping filter with a time offset of $7/2$ for the quadrature path and duration of $\pi$ for the symbol spacing. Using a constant envelope signal, optimum PLL loop filter setting can be found by the performance indicator circuitry 180 using ACLR minimization or PLL loop filter output variance minimization.

The performance indicator circuitry 180 may be used to optimize parameters of the PLL during debugging, self testing, and normal operation. The circuitry 180 may operate with specially generated signals like the constant envelope signal just described or with normal modulation signals like LTE signals. The performance indicator value can be used by automatic test equipment (ATE) to check the modulation performance. The performance indicator can be evaluated during the BIST using special test signals. During component evaluation, the performance indicator circuitry 180 can be used to optimize the system performance relevant parameters such as the LP/HP delay, the HP gain, and the oscillator linearization. During the chip booting phase, the performance indicator circuitry 180 can be used to auto calibrate PLL parameters and store the result in the performance memory 170 for use during PLL operation. During platform bring-up, a poor modulation that is identified based on a performance indicator value may be reported into a DigRF trace. This enables the root cause of the poor modulation to be found quickly.

Figure 4:
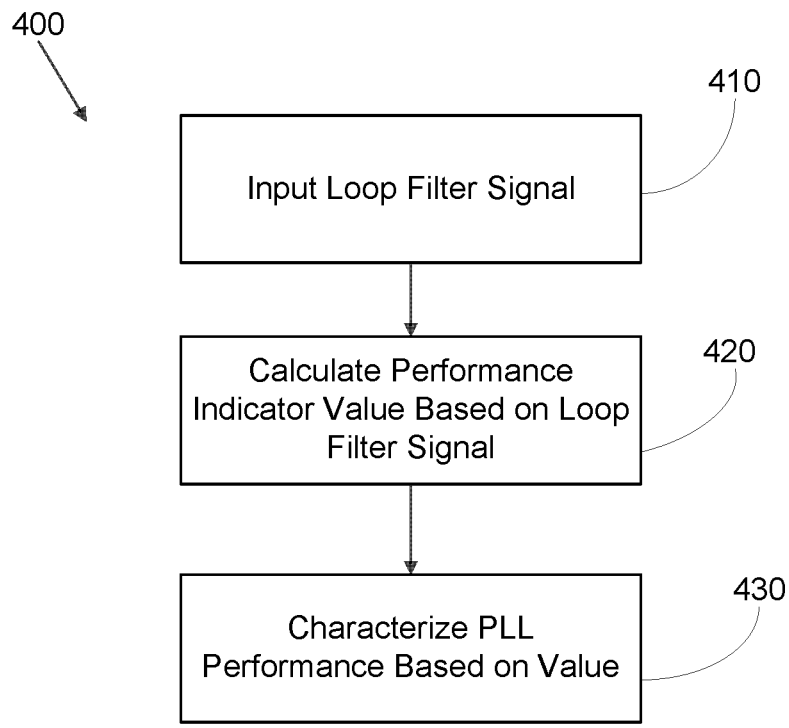
FIG. 4 illustrates a flow diagram of an exemplary method for determining PLL performance based on signals obtained from a loop filter in the PLL in accordance with various aspects described.

FIG. 4 illustrates a flow diagram outlining one embodiment of a method 400 for use with a phase locked loop that includes i) an oscillator configured to generate a phase modulated signal based on a control signal and ii) a loop filter. The loop filter includes a series of circuitry configured to filter a phase error between a feedback signal and a reference signal and to stabilize the loop. The feedback signal is based on a low pass signal and an output of the oscillator. Each circuitry in the series of circuitry outputs a respective unique loop filter signal. The method 400 may be performed by the performance indicator circuitry 180 of FIGS. 1-3. At 410 a loop filtered signal from the loop filter is input. The functionality of 410 may be performed by the first input circuitry or the second input circuitry of FIG. 3. At 420 a value for a performance indicator based on the loop filtered signal is calculated. The functionality of 420 may be performed by the parameter calculation circuitry of FIG. 3. At 430 performance of the PLL is characterized based on the value. The functionality of 430 may be performed by the parameter calculation circuitry of FIG. 3.

In one embodiment, the method includes storing the value in a memory for use in calibrating the PLL. In one embodiment, the method includes providing the value to alignment circuitry that adapts the frequency modulation signal for two point modulation by the PLL. In one embodiment, the method includes inputting the frequency modulation signal and calculating the value based on a correlation between the loop filtered signal and the frequency modulation signal. The frequency modulation signal is filtered to generate a filtered frequency modulation signal and the value is calculated based on a correlation between the loop filtered signal and the filtered frequency modulation signal.

In one embodiment, the loop filter comprises a gain circuitry that outputs an amplified signal, a low pass filter that outputs a filtered signal, and integrator circuitry that outputs an integrated signal, and the method includes selecting one of the amplified signal, the low pass signal, or the integrated signal and calculating the value based on the selected signal. In one embodiment, the method includes detecting a trigger signal, and in response, calculating a statistical characterization of the loop filtered signal over a predetermined time period.

It can be seen from the foregoing description that the performance indicator circuitry provides a method for determining the performance and quality of the phase modulation path during normal operation or with special modulation signals. Internal signals are used without reliance on external devices. The performance indicator circuitry can calculate any number of performance parameter values including variance, maximum, minimum, standard deviation of signals found in the low pass path.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Figure 5:
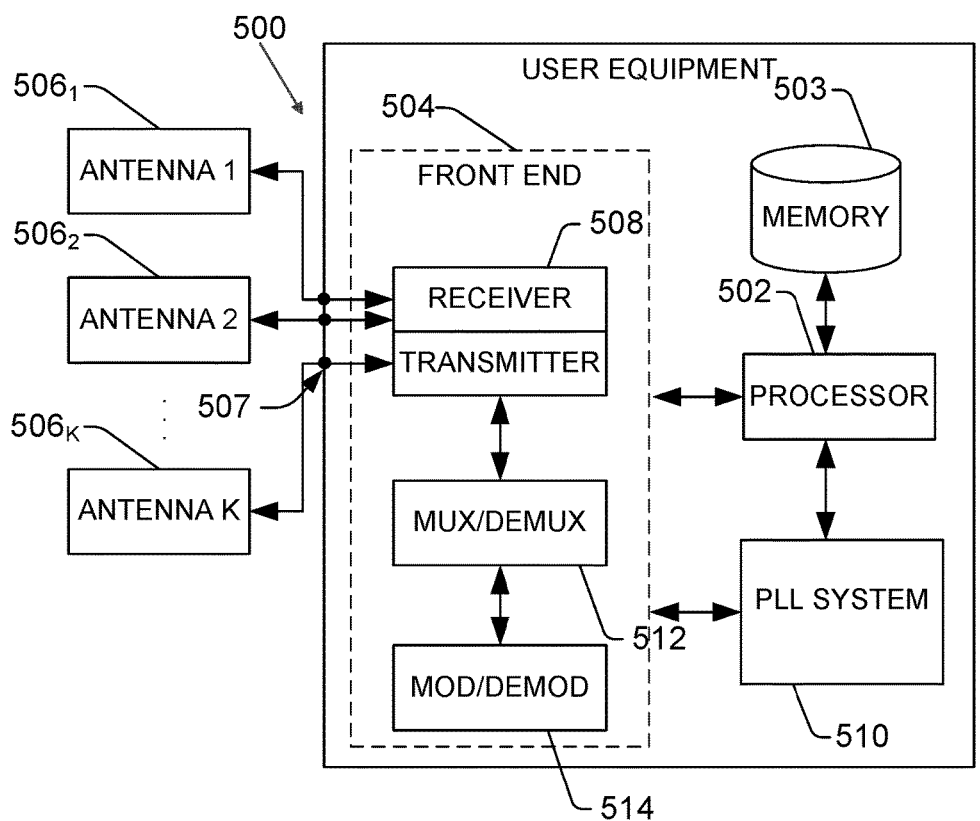
FIG. 5 illustrates an example user equipment device that includes a PLL system that utilizes performance indicator circuitry in accordance with various aspects described.

To provide further context for various aspects of the disclosed subject matter, FIG. 5 illustrates a block diagram of an embodiment of user equipment 500 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 500 can be utilized with one or more aspects of the PLLs devices described herein according to various aspects. The user equipment device 500, for example, comprises a digital baseband processor 502 that can be coupled to a data store or memory 503, a front end 504 (e.g., an RF front end, an acoustic front end, or the other like front end) and a plurality of antenna ports 507 for connecting to a plurality of antennas $506_1$ to $506_k$ (k being a positive integer). The antennas $506_1$ to $506_k$ can receive and transmit signals to and from one or more wireless devices such as access points, access terminals, wireless ports, routers and so forth, which can operate within a radio access network or other communication network generated via a network device (not shown).

The user equipment 500 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 504 can include a communication platform, which comprises electronic components and associated circuitry that provide for processing, manipulation or shaping of the received or transmitted signals via one or more receivers or transmitters (e.g. transceivers) 508, a mux/demux component 512, and a mod/demod component 514. The front end 504 is coupled to the digital baseband processor 502 and the set of antenna ports 507, in which the set of antennas $506_1$ to $906_k$ can be part of the front end. In one aspect, the user equipment device 500 can comprise a phase locked loop system 510 that include performance indicator circuitry as disclosed herein.

The processor 502 can confer functionality, at least in part, to substantially any electronic component within the mobile communication device 500, in accordance with aspects of the disclosure. As an example, the processor 500 can be configured to execute, at least in part, executable instructions that compute the value of a performance indicator for the phase locked loop system 510. Thus the processor 500 may embody various aspects of the performance indicator circuitry 180 of FIGS. 1-3.

The processor 502 is functionally and/or communicatively coupled (e.g., through a memory bus) to memory 503 in order to store or retrieve information necessary to operate and confer functionality, at least in part, to communication platform or front end 504, the phase locked loop system 510 and substantially any other operational aspects of the phase locked loop system 510. The phase locked loop system 510 includes at least one oscillator (e.g., a VCO, DCO or the like) that can be calibrated via core voltage, a coarse tuning value, signal, word or selection process according the various aspects described herein.

The processor 502 can operate to enable the mobile communication device 500 to process data (e.g., symbols, bits, or chips) for multiplexing/demultiplexing with the mux/demux component 512, or modulation/demodulation via the mod/demod component 514, such as implementing direct and inverse fast Fourier transforms, selection of modulation rates, selection of data packet formats, inter-packet times, etc. Memory 503 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation. Memory 503 may include a static random access memory (SRAM) that stores various parameters used for PLL tuning and/or the performance indicator value (e.g., the performance memory 170 of FIGS. 1-3).

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is performance indicator circuitry adapted to characterize performance of a phase locked loop (PLL) comprising an oscillator, a high pass path, and a low pass path comprising loop filter circuitry, wherein the PLL is in a phase path of a phase modulator. The performance indicator circuitry includes first input circuitry configured to input a signal from the loop filter circuitry and parameter calculation circuitry configured to: compute a value for a performance indicator based on the signal; and control an aspect of operation of the PLL based on the value.

Example 2 includes the subject matter of example 1, including or omitting optional elements, wherein the parameter calculation circuitry is configured to store the value in a memory for use in calibrating the PLL.

Example 3 includes the subject matter of example 1, including or omitting optional elements, wherein the parameter calculation circuitry is configured to provide the value to alignment circuitry, wherein the alignment circuitry is configured to process a frequency modulation signal for two point modulation by the PLL.

Example 4 includes the subject matter of any of examples 1-3, including or omitting optional elements, further including second input circuitry configured to input a frequency modulation signal, and wherein the parameter calculation circuitry is configured to calculate the value based on a correlation between the loop filter signal and the frequency modulation signal.

Example 5 includes the subject matter of example 4, including or omitting optional elements, wherein the second input circuitry includes a reference filter that inputs the frequency modulation signal and outputs a filtered frequency modulation signal; and a multiplexer that selects one of the filtered frequency modulation signal or the frequency modulation signal and inputs the selected signal to the parameter calculation circuitry.

Example 6 includes the subject matter of any of examples 1-3, including or omitting optional elements, wherein the loop filter circuitry comprises gain circuitry that outputs an amplified signal, a low pass filter that outputs a filtered signal, and integrator circuitry that outputs an integrated signal, wherein the first input circuitry comprises a multiplexer that selects one of the amplified signal, the low pass signal, or the integrated signal and inputs the selected signal to the parameter calculation circuitry.

Example 7 includes the subject matter of any of examples 1-3, including or omitting optional elements, wherein the parameter calculation circuitry is configured to compute a statistical characterization of the loop filter signal over time.

Example 8 includes the subject matter of example 7, including or omitting optional elements, further including trigger circuitry configured to detect a trigger signal, and in response, cause the performance calculation unit to compute the statistical characterization over a predetermined time period.

Example 9 is a phase modulator configured to process a frequency modulation signal to generate a phase modulated radio frequency (RF) signal for recombination with an amplitude modulation signal to generate a phase and amplitude modulated RF signal. The phase modulator includes alignment circuitry configured to process the frequency modulation signal to produce a low pass signal and a high pass signal; a phase locked loop that includes an oscillator configured to generate the phase modulated signal based on a control signal; and a loop filter that includes a series of circuitry, wherein each circuitry in the loop filter is configured to output a respective unique loop filter signal; and summation circuitry configured to add the high pass signal to the output of the loop filter circuitry to generate the control signal. Performance indicator circuitry includes input circuitry configured to input a selected loop filter signal and parameter calculation circuitry configured to compute a value for a performance indicator based at least on the loop filtered signal.

Example 10 includes the subject matter of example 9, including or omitting optional elements, wherein the parameter calculation circuitry is configured to store the value in a memory for use in calibrating the PLL.

Example 11 includes the subject matter of example 9, including or omitting optional elements, wherein the parameter calculation circuitry is configured to provide the value to the alignment circuitry for use in processing the frequency modulation signal.

Example 12 includes the subject matter of any of examples 9-11, including or omitting optional elements, further including: second input circuitry configured to input the frequency modulation signal, and wherein the parameter calculation circuitry is configured to calculate the value based on a correlation between the loop filtered signal and the frequency modulation signal.

Example 13 includes the subject matter of any of examples 9-11, including or omitting optional elements, wherein the second input circuitry includes a reference filter that inputs the frequency modulation signal and outputs a filtered frequency modulation signal; and a multiplexer that selects one of the filtered frequency modulation signal or the frequency modulation signal and inputs the selected signal to the parameter calculation circuitry.

Example 14 includes the subject matter of any of examples 9-11, including or omitting optional elements, wherein the loop filter includes gain circuitry that outputs an amplified signal, a low pass filter that outputs a filtered signal, and integrator circuitry that outputs an integrated signal, wherein the first input circuitry comprises a multiplexer that selects one of the amplified signal, the low pass signal, or the integrated signal and inputs the selected signal to the parameter calculation circuitry.

Example 15 includes the subject matter of any of examples 9-11, including or omitting optional elements, wherein the parameter calculation circuitry is configured to compute a statistical characterization of the loop filter signal over time.

Example 16 includes the subject matter of any of examples 9-11, including or omitting optional elements, further including trigger circuitry configured to detect a trigger signal, and in response, cause the performance calculation unit to compute the statistical characterization.

Example 17 is a method for use with a phase locked loop including an oscillator configured to generate a phase modulated signal based on a control signal and a loop filter comprising a series of circuitry, wherein each circuitry in the loop filter is configured to output a respective unique loop filter signal. The method includes: inputting a loop filter signal from the loop filter; computing a value for a performance indicator based on the loop filter signal; and characterizing performance of the PLL based on the value.

Example 18 includes the subject matter of example 17, including or omitting optional elements, including storing the value in a memory for use in calibrating the PLL.

Example 19 includes the subject matter of example 17, including or omitting optional elements, including providing the value to alignment circuitry configured to process the frequency modulation signal for two point modulation by the PLL.

Example 20 includes the subject matter of any of examples 17-19, including or omitting optional elements, including inputting the frequency modulation signal, and calculating the value based on a correlation between the loop filtered signal and the frequency modulation signal.

Example 21 includes the subject matter of example 20, including or omitting optional elements, including filtering the frequency modulation signal to generate a filtered frequency modulation signal; and calculating the value based on a correlation between the loop filtered signal and the filtered frequency modulation signal.

Example 22 includes the subject matter of any of examples 17-19, including or omitting optional elements, wherein the loop filter includes gain circuitry that outputs an amplified signal, a low pass filter that outputs a filtered signal, and integrator circuitry that outputs an integrated signal. The method includes selecting one of the amplified signal, the low pass signal, or the integrated signal; and calculating the value based on the selected signal.

Example 23 includes the subject matter of any of examples 17-19, including or omitting optional elements, including detecting a trigger signal, and in response, calculating a statistical characterization of the loop filtered signal over a predetermined time period.

Example 24 is an apparatus for use with a phase locked loop comprising an oscillator configured to generate a phase modulated signal based on a control signal and a loop filter comprising a series of circuitry, wherein each circuitry in the series of circuitry is configured to output a respective unique loop filter signal. The apparatus includes means for inputting a loop filter signal from the loop filter; means for computing a value for a performance indicator based on the loop filter signal; and means for characterizing performance of the PLL based on the value.

Example 25 includes the subject matter of example 24, including or omitting optional elements, including means for detecting a trigger signal, and in response, causing the means for computing to calculate a statistical characterization of the loop filtered signal over a predetermined time period.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. Performance indicator circuitry adapted to characterize performance of a phase locked loop (PLL) comprising an oscillator, a high pass path, and a low pass path comprising loop filter circuitry, wherein the PLL is in a phase path of a phase modulator, the performance indicator circuitry comprising:
   first input circuitry configured to input a signal from the loop filter circuitry;
   parameter calculation circuitry configured to:
      compute a value for a performance indicator based on the signal; and
      control an aspect of operation of the PLL based on the value;
   second input circuitry configured to input a frequency modulation signal, comprising:
      a reference filter that inputs the frequency modulation signal and outputs a filtered frequency modulation signal; and
      a multiplexer that selects one of the filtered frequency modulation signal or the frequency modulation signal and inputs the selected signal to the parameter calculation circuitry; and
   wherein the parameter calculation circuitry is configured to calculate the value based on a correlation between the loop filter signal and the frequency modulation signal.

2. The performance indicator circuitry of claim 1, wherein the parameter calculation circuitry is configured to store the value in a memory for use in calibrating the PLL.

3. The performance indicator circuitry of claim 1, wherein the parameter calculation circuitry is configured to provide the value to alignment circuitry, wherein the alignment circuitry is configured to process the frequency modulation signal for two point modulation by the PLL.

4. Performance indicator circuitry adapted to characterize performance of a phase locked loop (PLL) comprising an oscillator, a high pass path, and a low pass path comprising loop filter circuitry, wherein the PLL is in a phase path of a phase modulator, wherein the loop filter circuitry comprises gain circuitry that outputs an amplified signal, a low pass filter that outputs a filtered signal, and integrator circuitry that outputs an integrated signal, the performance indicator circuitry comprising:

first input circuitry comprising a multiplexer that selects one of the amplified signal, the low pass signal, or the integrated signal; and parameter calculation circuitry configured to:
compute a value for a performance indicator based on the selected signal; and
control an aspect of operation of the PLL based on the value.

5. Performance indicator circuitry adapted to characterize performance of a phase locked loop (PLL) comprising an oscillator, a high pass path, and a low pass path comprising loop filter circuitry, wherein the PLL is in a phase path of a phase modulator, the performance indicator circuitry comprising:

first input circuitry configured to input a signal from the loop filter circuitry;

parameter calculation circuitry configured to compute a value of a statistical characterization of the loop filter signal over time and control an aspect of operation of the PLL based on the value; and trigger circuitry configured to detect a trigger signal, and in response, cause the parameter calculation unit to compute the statistical characterization over a predetermined time period.

6. A phase modulator configured to process a frequency modulation signal to generate a phase modulated radio frequency (RF) signal for recombination with an amplitude modulation signal to generate a phase and amplitude modulated RF signal, the phase modulator comprising:

alignment circuitry configured to process the frequency modulation signal to produce a low pass signal and a high pass signal;

a phase locked loop, comprising:
an oscillator configured to generate the phase modulated RF signal based on a control signal;
a loop filter comprising a series of circuitry, wherein each circuitry in the loop filter is configured to output a respective unique loop filter signal; and
summation circuitry configured to add the high pass signal to an output of the loop filter to generate the control signal; and performance indicator circuitry comprising:
first input circuitry configured to input a selected loop filter signal;
parameter calculation circuitry configured to compute a value for a performance indicator based at least on the loop filter signal; and
second input circuitry configured to input the frequency modulation signal, comprising:
a reference filter that inputs the frequency modulation signal and outputs a filtered frequency modulation signal; and
a multiplexer that selects one of the filtered frequency modulation signal or the frequency modulation signal and inputs the selected signal to the parameter calculation circuitry, and wherein the parameter calculation circuitry is configured to calculate the value based on a correlation between the loop filter signal and the frequency modulation signal.

7. The phase modulator of claim 6, wherein the parameter calculation circuitry is configured to store the value in a memory for use in calibrating the PLL.

8. The phase modulator of claim 6, wherein the parameter calculation circuitry is configured to provide the value to the alignment circuitry for use in processing the frequency modulation signal.

9. A phase modulator configured to process a frequency modulation signal to generate a phase modulated radio frequency (RF) signal for recombination with an amplitude modulation signal to generate a phase and amplitude modulated RF signal, the phase modulator comprising:

alignment circuitry configured to process the frequency modulation signal to produce a low pass signal and a high pass signal;

a phase locked loop, comprising:
an oscillator configured to generate the phase modulated RF signal based on a control signal;
a loop filter comprising gain circuitry that outputs an amplified signal, a low pass filter that outputs a filtered signal, and integrator circuitry that outputs an integrated signal; and
summation circuitry configured to add the high pass signal to the output of the loop filter to generate the control signal; and performance indicator circuitry comprising:
input circuitry comprising a multiplexer that selects one of the amplified signal, the low pass signal, or the integrated signal; and
parameter calculation circuitry configured to compute a value for a performance indicator based at least on the selected signal.

10. A phase modulator configured to process a frequency modulation signal to generate a phase modulated radio frequency (RF) signal for recombination with an amplitude modulation signal to generate a phase and amplitude modulated RF signal, the phase modulator comprising:

alignment circuitry configured to process the frequency modulation signal to produce a low pass signal and a high pass signal;

a phase locked loop, comprising:
an oscillator configured to generate the phase modulated RF signal based on a control signal;
a loop filter comprising a series of circuitry, wherein each circuitry in the loop filter is configured to output a respective unique loop filter signal; and
summation circuitry configured to add the high pass signal to the output of the loop filter circuitry to generate the control signal; and performance indicator circuitry comprising:
input circuitry configured to input a selected loop filter signal; and
parameter calculation circuitry configured to compute a statistical characterization of the loop filter signal over time; and
trigger circuitry configured to detect a trigger signal, and in response, cause the parameter calculation unit to compute the statistical characterization.

11. A method for use with a phase locked loop comprising an oscillator configured to generate a phase modulated signal based on a control signal and a loop filter comprising a series of circuitry, wherein each circuitry in the loop filter is configured to output a respective unique loop filter signal, the method comprising:

inputting a loop filter signal from the loop filter;
inputting a frequency modulation signal;
filtering the frequency modulation signal;
computing a value for a performance indicator based on a correlation between the loop filter signal and the filtered frequency modulation signal; and characterizing performance of the PLL based on the value.

12. The method of claim 11, comprising storing the value in a memory for use in calibrating the PLL.

13. The method of claim 11, comprising providing the value to alignment circuitry configured to process the frequency modulation signal for two point modulation by the PLL.

14. The method of claim 11, further comprising detecting a trigger signal, and in response, calculating a statistical characterization of the loop filter signal over a predetermined time period.

15. A method for use with a phase locked loop comprising an oscillator configured to generate a phase modulated signal based on a control signal and a loop filter comprising a gain circuitry that outputs an amplified signal, a low pass filter that outputs a filtered signal, and integrator circuitry that outputs an integrated signal, the method comprising:
- selecting one of the amplified signal, the low pass signal, or the integrated signal;
- inputting the selected signal; and
- computing a value for a performance indicator based on the selected signal; and
- characterizing performance of the PLL based on the value.

* * * * *